United States Patent
Ricci

(10) Patent No.: US 7,543,214 B2
(45) Date of Patent: Jun. 2, 2009

(54) METHOD AND SYSTEM FOR PERFORMING CRC

(75) Inventor: Paul B. Ricci, Coto De Caza, CA (US)

(73) Assignee: Marvell International Ltd., Hamilton (BM)

( * ) Notice: Subject to any disclaimer, the term of this patent is extended or adjusted under 35 U.S.C. 154(b) by 558 days.

(21) Appl. No.: 11/056,320

(22) Filed: Feb. 11, 2005

(65) Prior Publication Data

US 2005/0204263 A1 Sep. 15, 2005

Related U.S. Application Data

(60) Provisional application No. 60/544,584, filed on Feb. 13, 2004.

(51) Int. Cl.
*H03M 13/00* (2006.01)
(52) U.S. Cl. .................................. 714/758; 714/776
(58) Field of Classification Search .................. 714/758, 714/776
See application file for complete search history.

(56) References Cited

U.S. PATENT DOCUMENTS

| | | | | |
|---|---|---|---|---|
| 4,224,676 A | * | 9/1980 | Appelt | 708/190 |
| 4,277,844 A | * | 7/1981 | Hancock et al. | 714/755 |
| 5,369,649 A | * | 11/1994 | Murayama et al. | 714/781 |
| 5,410,546 A | * | 4/1995 | Boyer et al. | 714/763 |
| 5,446,745 A | * | 8/1995 | Gibbs | 714/758 |
| 6,820,228 B1 | * | 11/2004 | Keller | 714/757 |
| 6,912,683 B2 | * | 6/2005 | Rifaat et al. | 714/774 |
| 7,111,228 B1 | * | 9/2006 | Ricci | 714/805 |
| 7,174,498 B2 | * | 2/2007 | Weissinger | 714/785 |
| 2003/0039235 A1 | * | 2/2003 | Odenwalder et al. | 370/342 |
| 2005/0114751 A1 | * | 5/2005 | Ungstad | 714/781 |

* cited by examiner

*Primary Examiner*—Mujtaba K Chaudry

(57) ABSTRACT

A method and system for accumulating CRC value is provided. The system includes a disk controller with a register for staging data segments of variable size, a CRC accumulator for accumulating CRC for data segments of variable size, a feedback multiplier that receives processed upper bits from the CRC accumulator containing previously accumulated CRC and incoming data segments from the register; and bits from the multiplier and the CRC accumulator are added and result from the adding is stored in the CRC accumulator. The method includes processing upper bits from the CRC accumulator containing previously accumulated CRC and incoming data segments, sending the processed results to the multiplier; adding bits from the multiplier and the CRC accumulator, and storing a result from the adding of the bits in the CRC accumulator and the multiplier.

20 Claims, 12 Drawing Sheets

FIGURE 4(i)

Table 1 – 32 bit CRC Feedback Matrix

FIGURE 4(ii)

| N | 0 | 1 | 2 | 3 | 4 |
|---|---|---|---|---|---|
| Residue | 20 | 16 | 12 | 8 | 4 |

Table 2 -- Possible Residues for Last CRC computation

FIGURE 5

| N | 0 | 1 | 2 | 3 | 4 |
|---|---|---|---|---|---|
| Enabled bits | 19:0 | 15:0 | 11:0 | 7:0 | 3:0 |

Table 3– Bits to Enable Feedback Multiplier 202 for Last data Segment

FIGURE 6

| N | 0 | 1 | 2 | 3 | 4 |
|---|---|---|---|---|---|
| Bits to Shift | 11:0 | 15:0 | 19:0 | 23:0 | 27:0 |
| Places to Shift | 20 | 16 | 12 | 8 | 4 |
| Resulting Position | 31:20 | 31:16 | 31:12 | 31:8 | 31:4 |

Table 4– Bits from CRC Accumulator 203 to be Justified to Most Significant Bit for Last Data Segment Calculation

FIGURE 7

| Barred Shifter Output Bit | 0 | 1 | N 2 | 3 | 4 |
|---|---|---|---|---|---|
| 31 | 11 | 15 | 19 | 23 | 27 |
| 30 | 10 | 14 | 18 | 22 | 26 |
| 29 | 9 | 13 | 17 | 21 | 25 |
| 28 | 8 | 12 | 16 | 20 | 24 |
| 27 | 7 | 11 | 15 | 19 | 23 |
| 26 | 6 | 10 | 14 | 18 | 22 |
| 25 | 5 | 9 | 13 | 17 | 21 |
| 24 | 4 | 8 | 12 | 16 | 20 |
| 23 | 3 | 7 | 11 | 15 | 19 |
| 22 | 2 | 6 | 10 | 14 | 18 |
| 21 | 1 | 5 | 9 | 13 | 17 |
| 20 | 0 | 4 | 8 | 12 | 16 |
| 19 | Masked Off | 3 | 7 | 11 | 15 |

FIGURE 8(i)

| A |  |  |  |  | B |
|---|---|---|---|---|---|
| 18 | Masked Off | 2 | 6 | 10 | 14 |
| 17 | Masked Off | 1 | 5 | 9 | 13 |
| 16 | Masked Off | 0 | 4 | 8 | 12 |
| 15 | Masked Off | Masked Off | 3 | 7 | 11 |
| 14 | Masked Off | Masked Off | 2 | 6 | 10 |
| 13 | Masked Off | Masked Off | 1 | 5 | 9 |
| 12 | Masked Off | Masked Off | 0 | 4 | 8 |
| 11 | Masked Off | Masked Off | Masked Off | 3 | 7 |
| 10 | Masked Off | Masked Off | Masked Off | 2 | 6 |
| 9 | Masked Off | Masked Off | Masked Off | 1 | 5 |
| 8 | Masked Off | Masked Off | Masked Off | 0 | 4 |
| 7 | Masked Off | Masked Off | Masked Off | Masked Off | 3 |
| 6 | Masked Off | Masked Off | Masked Off | Masked Off | 2 |
| 5 | Masked Off | Masked Off | Masked Off | Masked Off | 1 |
| 4 | Masked Off | Masked Off | Masked Off | Masked Off | 0 |

Table 5 – Programmable Barrel Shifter and Mask

FIGURE 8(ii)

METHOD AND SYSTEM FOR PERFORMING CRC

CROSS REFERENCE TO RELATED APPLICATIONS

This utility patent application claims priority under 35 U.S.C. § 119(e)(1) to the following provisional patent application:

Ser. No. 60/544,584, entitled "Method and System for Performing CRC" filed on Feb. 13, 2004, and Inventor: Paul B. Ricci.

The disclosure of the foregoing provisional patent application is incorporated herein, in its entirety.

FIELD OF THE INVENTION

The present invention relates to disk controllers, and more particularly to performing CRC.

BACKGROUND OF THE INVENTION

Conventional computer systems typically include several functional components. These components may include a central processing unit (CPU), main memory, input/output ("I/O") devices, and disk drives. In conventional systems, the main memory is coupled to the CPU via a system bus or a local memory bus. The main memory is used to provide the CPU access to data and/or program information that is stored in main memory at execution time. Typically, the main memory is composed of random access memory (RAM) circuits. A computer system with the CPU and main memory is often referred to as a host system.

The main memory is typically smaller than disk drives and may be volatile. Programming data is often stored on the disk drive and read into main memory as needed. The disk drives are coupled to the host system via a disk controller that handles complex details of interfacing the disk drives to the host system. Communications between the host system and the disk controller is usually provided using one of a variety of standard input/output ("I/O") bus interfaces.

Typically, a disk drive includes one or more magnetic disks. Each disk typically has a number of concentric rings or tracks on which data is stored. The tracks themselves may be divided into sectors, which are the smallest accessible data units. A positioning head above the appropriate track accesses a sector. An index pulse typically identifies the first sector of a track. The start of each sector is identified with a sector pulse.

Typically, the disk drive waits until a desired sector rotates beneath the head before proceeding a read or write operation. Data is accessed serially; one bit at a time and typically, each disk have its own read/write head.

The disk drive is connected to the disk controller that performs numerous functions, for example, converting digital data to analog head signals, disk formatting, error checking and fixing, logical to physical address mapping and data buffering. To perform the various functions for transferring data, the disk controller includes numerous components.

A conventional disk drive stores data bytes on disk drive platters in sets of a predetermined length. A disk drive controller or a host computer may generate error correction code (ECC) bytes and cyclic redundancy check (CRC) bytes for each set of data bytes. Sometimes, the host computer generates CRC bytes, and the disk controller generates its own set of CRC bytes. The CRC and the ECC bytes are appended to the end of the set of data bytes. The data bytes, CRC bytes and ECC bytes together make up a "sector" (shown in FIG. 1B), and this sector is stored on the disk platter.

When the disk drive controller reads a sector off the disk, the data bytes and CRC bytes are stored in a buffer unit (memory) in the disk drive. An ECC unit detects and corrects errors in the sector read off the platter. These corrections are made to the data bytes and CRC bytes stored in the buffer unit.

CRC is one way to maintain and validate data integrity. CRC bytes are generated and stored for each data set. CRC involves a process that operates on a block of data and generates a number that represents the content and organization of the data block. CRC provides a mathematical code that allows one to easily detect if the stored data has been corrupted. Typically, the CRC is transported and stored with the data and is checked as the data is transported, or when the data is retrieved from memory.

A typical circuit employing CRC error checking includes a CRC checker to verify integrity for old data and a CRC generator that generates CRC information for any new data and a CRC accumulator that stores the CRC values.

Often there is a need to compute CRC's in parallel to write operations to meet speed requirements. Also, data may be submitted in segments that are different in size.

Conventional disk controllers typically use a disk formatter with an 8-bit interface for handling the CRC functionality. The sector size for the conventional disk controller is 512 KB. Both the data segments and the CRC have an 8-bit boundary.

Newer disk controllers now use a 10-bit symbol interface and hence 20-bits are sent for CRC leaving a residue. Conventional disk controllers need to handle the residue effectively, without making complex changes.

Conventional techniques fail to provide an efficient solution for accumulating an r bit CRC on multiple n bit data blocks of varying sizes, and then apply them to the requirements for another interface, for example, a 10-bit symbol disk formatter interface. Therefore there is a need for an efficient CRC method and system so that CRC can be performed efficiently for different sector sizes/data formatter interface.

SUMMARY OF THE PRESENT INVENTION

In one aspect of the present invention, a method for processing data segments used for calculating cyclic redundancy check ("CRC") is provided. The method includes, processing upper bits from a CRC accumulator containing previously accumulated CRC and incoming data segments; sending the processed results to a multiplier; adding bits from the multiplier and the CRC accumulator; and storing a result from the adding of the bits in the CRC accumulator and the multiplier, wherein CRC may be accumulated on any size data segment.

The upper bits from the CRC accumulator are XORed with the incoming data segments, and the XORed result may be masked before it is sent to the multiplier for a last data segment. The number of masked bits depends on the last data segment size. Also, the bits from the accumulator that are added to the bits from the multiplier are rotated.

In another aspect of the present invention, a disk controller for accumulating cyclic redundancy check ("CRC") values is provided. The disk controller includes a register for staging data segments of variable size; a CRC accumulator for accumulating CRC for data segments of variable size; a feedback multiplier that receives processed upper bits from the CRC accumulator containing previously accumulated CRC and incoming data segments from the register; and bits from the multiplier and the CRC accumulator are added and result from the adding is stored in the CRC accumulator.

In yet another aspect of the present invention, a storage system is provided. The storage system includes, a storage device; and a storage device controller for accumulating cyclic redundancy check ("CRC") values that includes a register for staging data segments of variable size; a CRC accumulator for accumulating CRC for data segments of variable size; a feedback multiplier that receives processed upper bits from the CRC accumulator containing previously accumulated CRC and incoming data segments from the register; and bits from the multiplier and the CRC accumulator are added and result from the adding is stored in the CRC accumulator.

This brief summary has been provided so that the nature of the invention may be understood quickly. A more complete understanding of the invention can be obtained by reference to the following detailed description of the preferred embodiments thereof concerning the attached drawings.

BRIEF DESCRIPTION OF THE DRAWINGS

The foregoing features and other features of the present invention will now be described with reference to the drawings of a preferred embodiment. In the drawings, the same components have the same reference numerals. The illustrated embodiment is intended to illustrate, but not to limit the invention. The drawings include the following Figures:

FIG. 4 [4($i$) and 4($ii$)] shows Table 1 with matrix computations for CRC accumulation, according to one aspect of the present invention;

FIG. 5 shows Table 2 with possible residues for a 20-bit symbol size, according to one aspect of the present invention;

FIG. 6 shows Table 3 with bits that are used to enable a feedback multiplier for a last data segment, according to one aspect of the present invention;

FIG. 7 shows Table 4 with bits from a CRC accumulator to be justified to MSB for last data segment calculation, according to one aspect of the present invention; and FIG. 8 [8($i$) and 8($ii$)] shows a Table 5 with values from a programmable barrel shifter and mask, used according to one aspect of the present invention.

DETAILED DESCRIPTION OF THE PREFERRED EMBODIMENTS

Overall Description of a "Disk Controller":

To facilitate an understanding of the preferred embodiment, the general architecture and operation of a disk drive system will initially be described. The specific architecture and operation of the preferred embodiment will then be described with reference to the general architecture and operation of a disk drive system.

Figure 1A:
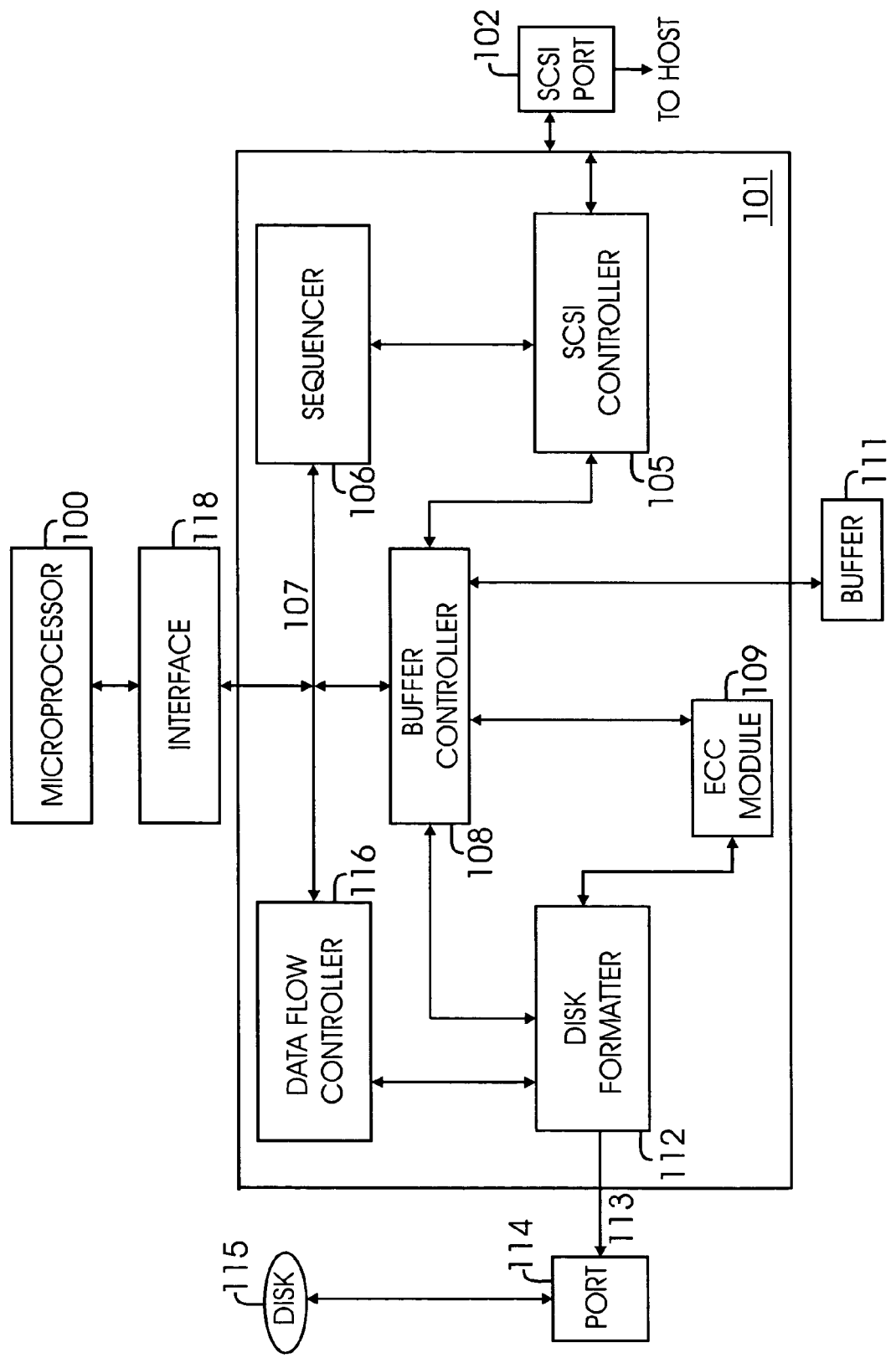
FIG. 1A shows a block diagram of a disk drive system, used according to one aspect of the present invention.
Figure 1B:
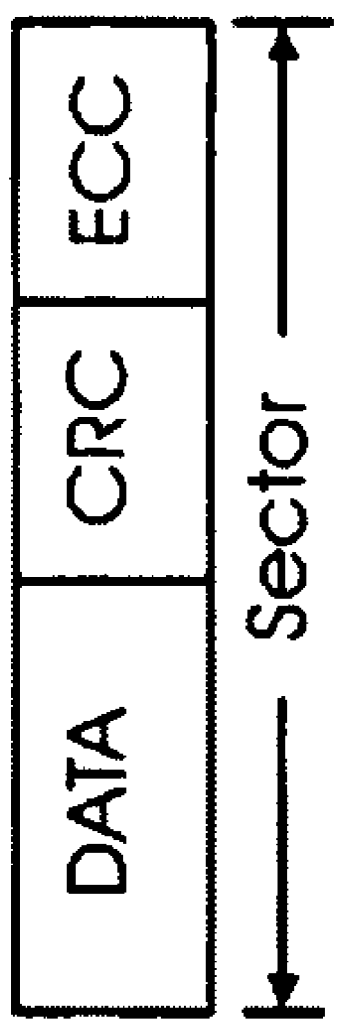
FIG. 1B shows an example of a sector, used according to one aspect of the present invention.

The disk drive system of FIG. 1A is an example of an internal (hard) disk drive included in a computer system. The host computer (not shown) and the disk drive communicate via port 102, which is connected to a data bus (not shown). In an alternate embodiment (not shown), the disk drive is an external storage device, which is connected to the host computer via a data bus. The data bus, for example, is a bus in accordance with a Small Computer System Interface (SCSI) specification. Those skilled in the art will appreciate that other communication buses known in the art can be used to transfer data between the disk drive and the host system.

As shown in FIG. 1A, the disk drive includes disk controller 101, which is coupled to SCSI port 102, disk port 114, buffer memory 111 and microprocessor 100. Interface 118 serves to couple microprocessor bus 107 to microprocessor 100. A read only memory ("ROM") omitted from the drawing is used to store firmware code executed by microprocessor 100. Disk port 114 couples disk controller 101 to hard disk assembly (also referred to herein as "disk") 115.

As is standard in the industry, data is stored on disk 115 in sectors. Each sector is byte structured and includes various fields, referred to as the sector format. A typical sector format includes a logical block address ("LBA") of about four bytes followed by a data field of about 512 bytes. The LBA contains position information. A field for a CRC checksum of 4 bytes typically follows the data field. A subsequent field for a number of ECC bytes, for example 40-80 bytes, is located at the end of the sector.

Controller 101 can be an integrated circuit (IC) that comprises of various functional modules, which provide for the writing and reading of data stored on disk 115. Microprocessor 100 is coupled to controller 101 via interface 118 to facilitate transfer of data, address, and control information. Buffer memory 111 is coupled to controller 101 via ports to facilitate transfer of data, and address information.

SCSI controller 105 includes programmable registers and state machine sequencers that interface with SCSI port 102 on one side and to a fast, buffered direct memory access (DMA) channel on the other side.

Sequencer 106 that interfaces with data flow controller 116 supports customized SCSI sequences, for example, by means of an instruction memory that allows users to customize command automation features. Sequencer 106 support's firmware and hardware interrupts schemes.

Disk formatter 112 is a disk interface controller and performs control operations when microprocessor 100 loads control information and parameter values into a writable control store (WCS) RAM (not shown) and issues a command. Disk formatter 112 executes the command with no microprocessor 100 intervention.

Buffer controller 108 can be a multi-channel, high speed DMA controller. Buffer controller 108 connects buffer memory 111 to disk formatter 112 and to an ECC channel of ECC module 109, a SCSI channel of SCSI controller 105 and micro-controller bus 107. Buffer controller 108 regulates data movement into and out of buffer memory 111.

To read data from disk 115, a host system sends a read command to disk controller 101, which interrupts Microprocessor 100, which then fetches the command from disk controller 101 and initializes the various functional blocks of disk controller 101. Data is read from disk 115 and is passed through disk formatter 112 simultaneously to buffer controller 108 and to ECC module 109. ECC module 109 provides the ECC mask for errors, which occurred during the read operation, while data is still in buffer controller 108. The error is corrected and corrected data is sent to buffer memory 111, and then passed to the host system.

To write data, a host system sends a write command to disk controller 101 and is stored in buffer 111. Microprocessor 100 reads the command out of buffer 111 and sets up plural registers. Data is transferred from host and is first stored in buffer 111, before being written to disk 115. CRC values are calculated based on the LBA for the sector being written. Data is read out of buffer 111, appended with ECC code and written to disk 115.

Before describing the adaptive aspects of the present invention, the following describes background information for CRC computation:

CRC Background:

CRC's are computed using a generator polynomial. Multiplying a message word by the generator polynomial creates a code word, which maps into the null space of a parity polynomial. For practical reasons a systematic technique is used to generate codes so that the original message is easily extracted from the computed code word. The following equation (1) shows a CRC technique:

$$CRC = x^r m(x)/g(x) \bmod(x^r - 1). \quad (1)$$

In equation (1), r is the size of the CRC block and x is a variable.

The CRC division operation may also be expressed as expressed as: $CRC = x^r m(x) - q(x)g(x)$ Where q(x) is a quotient polynomial, the degree of the CRC is less than r.

Figure 2A:
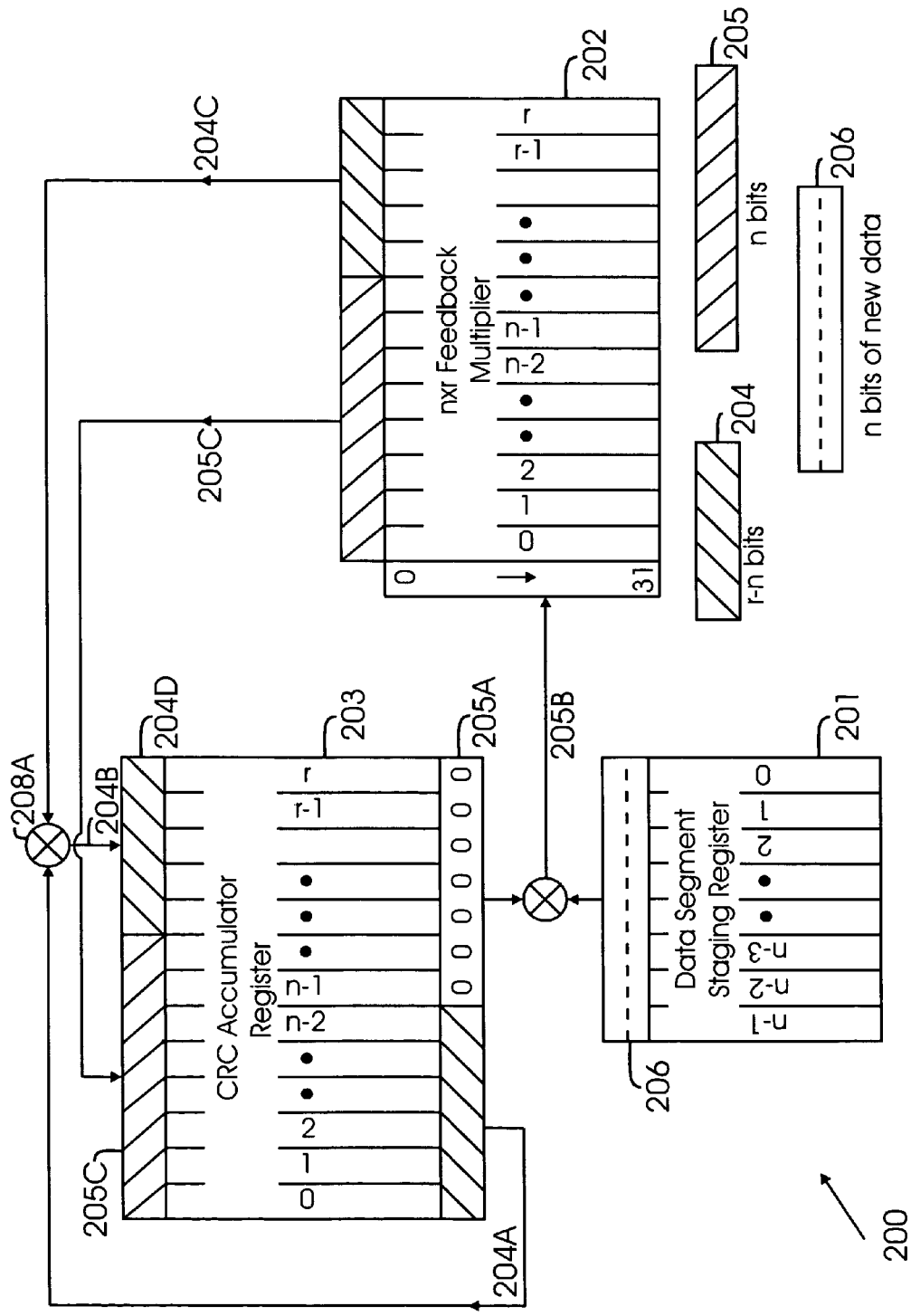
FIG. 2A shows a schematic for n-bit accumulation of r bit CRC, according to one aspect of the present invention.

Parallel CRC Accumulation:

For parallel CRC implementation, as shown in FIG. 2A, a CRC register shown as the CRC Accumulator Register 203 of FIG. 2A maintains a current CRC residue value. The CRC residue value is then XOR'ed (added modulo 2) to a current data value, which may be a 32-bit value. The sum is passed through a feedback multiplier circuit (202 FIG. 2A). The remainder (the result of the modulo polynomial division in the feedback multiplier circuit 202) is stored as the new residue in the CRC accumulator register 203.

Data is presented as a number of bytes or segments (size n), and the CRC is computed iteratively as each new segment of the data (or message) is presented. Consider the case of a data word composed of multiple concatenated segments $m_0 m_1 m_2 m_3 \ldots$ where segment 0 is presented for CRC calculation first. If all segments are of equal length n, the CRC for segment $m_0$ is computed as follows:

$$C_0 = x^r m_0(x) - g(x) q_0(x) \quad (2)$$

The CRC value $C_{01}$ for $m_0 m_1$ would be:

$$C_{01} = x^{(r+n)} m_0(x) + x^r m_1(x) - g(x)[x^n q_0(x) + q_1(x)] \quad (3)$$

This can be reformulated to account for the previous calculation of $C_0$ $$C_{01} = x^n C_0(x) + x^r m_1(x) - g(x) q_1(x)) \quad (4)$$

Consider the form of $C_0(x)$, where $C_0(x)$ has a degree less than r and $C_0(x)$ can be parsed into two pieces, the least significant r−n bits, designated as $C_0'(x)$ and the most significant n terms designated as $C_0''(x)$. Hence, $C_0(x)$ may be represented in terms of $C_0''$ and $C_0'$:

$$C_0(x) = x^{r-n} C_0''(x) + C_0'(x)$$

Multiplying $C_0(x)$ by $x^n$ gives:

$$x^n C_0(x) = x^r C_0''(x) + x^n C_0'(x)$$

Substituting back into equation (4):

$$C_{01} = x^r C_0''(x) + x^n C_0'(x) + x^r m_1(x) - g(x) q_1(x)$$

$$C_{01} = x^r [C_0''(x) + m_1(x)] - g(x) q_1(x) + x^n C_0'(x)$$

Since $x^n C_0'(x)$ taken $\bmod(x^{r+1}-1)$ is by definition $C_0'$ shifted n places, since $C_0'$ is of dimension r−n this is a shift to the most significant bits of $C_{01}$. In the end we get:

$$C_{01} = x^n C_0'(x) + \{x^r [C_0''(x) + m_1(x)] - g(x) q_1(x)\} \quad (5)$$

Equation (5) shows that $C_{01}(x)$ is the sum of the n bit shift of lower r−n bits of $C_0(x)$ with the reduced sum of the upper n bits of $C_0(x)$ (i.e. $C_0''$) added to the next message segment $m_1$. The sum is reduced through division by $g(x) \bmod(x^r - 1)$.

This may be achieved by XOR'ing (adding modulo 2) the n upper bits of the previous CRC calculation with the next message segment m1, and passing the result through the feedback multiplier 202. The result of the reduction is then added to the n bit shifted value of the least significant r−n bits of the previous CRC calculation. The sum is the CRC for the combined segments $m_0 m_1$.

Data Order:

Data flow through a CRC accumulator (203, FIG. 2A) may be serial or parallel. In serial form, data is presented in time order (i.e. first bit of data is considered most significant data input to the CRC feedback multiplier 202) and the bit furthest from the input is the most significant bit ("MSb") of the CRC accumulator 203.

In parallel form, there are two choices: bit 0 is considered a first bit (i.e. MSb input to CRC feedback multiplier 202), or bit n is considered first bit. Fibre Channel and SCSI standards (incorporated herein by reference in its entirety) have chosen the first convention, and for these interfaces the least significant data is transferred first across the interface that will make the least significant bytes/bits of the parallel data word the first to be processed by the CRC circuit.

Likewise the first data exiting the CRC generator, the MSb of the CRC accumulator, will become the least significant bit of the parallel data word. This has the effect of bit-reversing input and output data from a conventional feedback generator. The double bit-reverse occurs for parallel data based on the assumption that the LSb is transferred first, and the need for the CRC circuit to process data in time order.

Figure 4I:
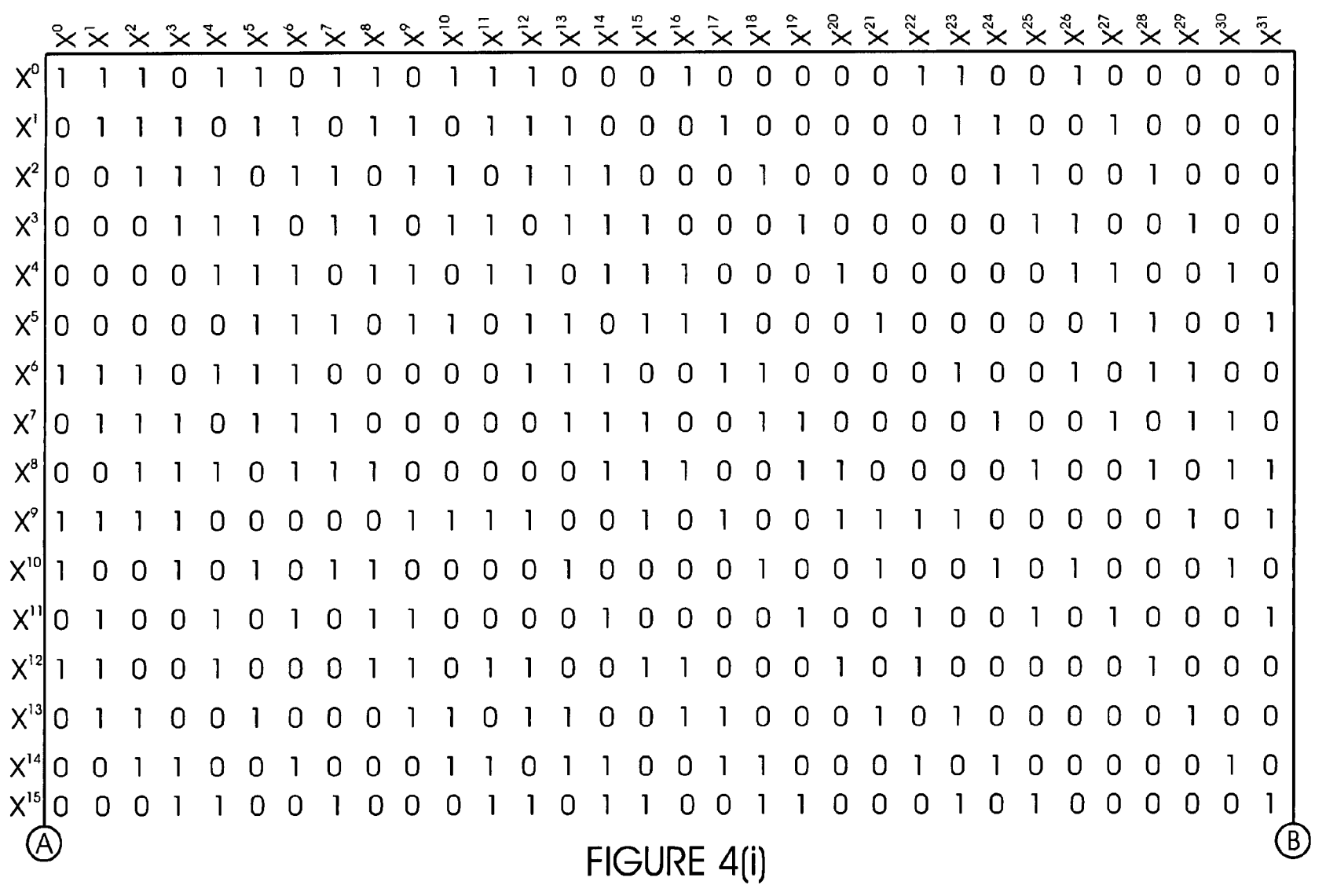
Figure 4II:
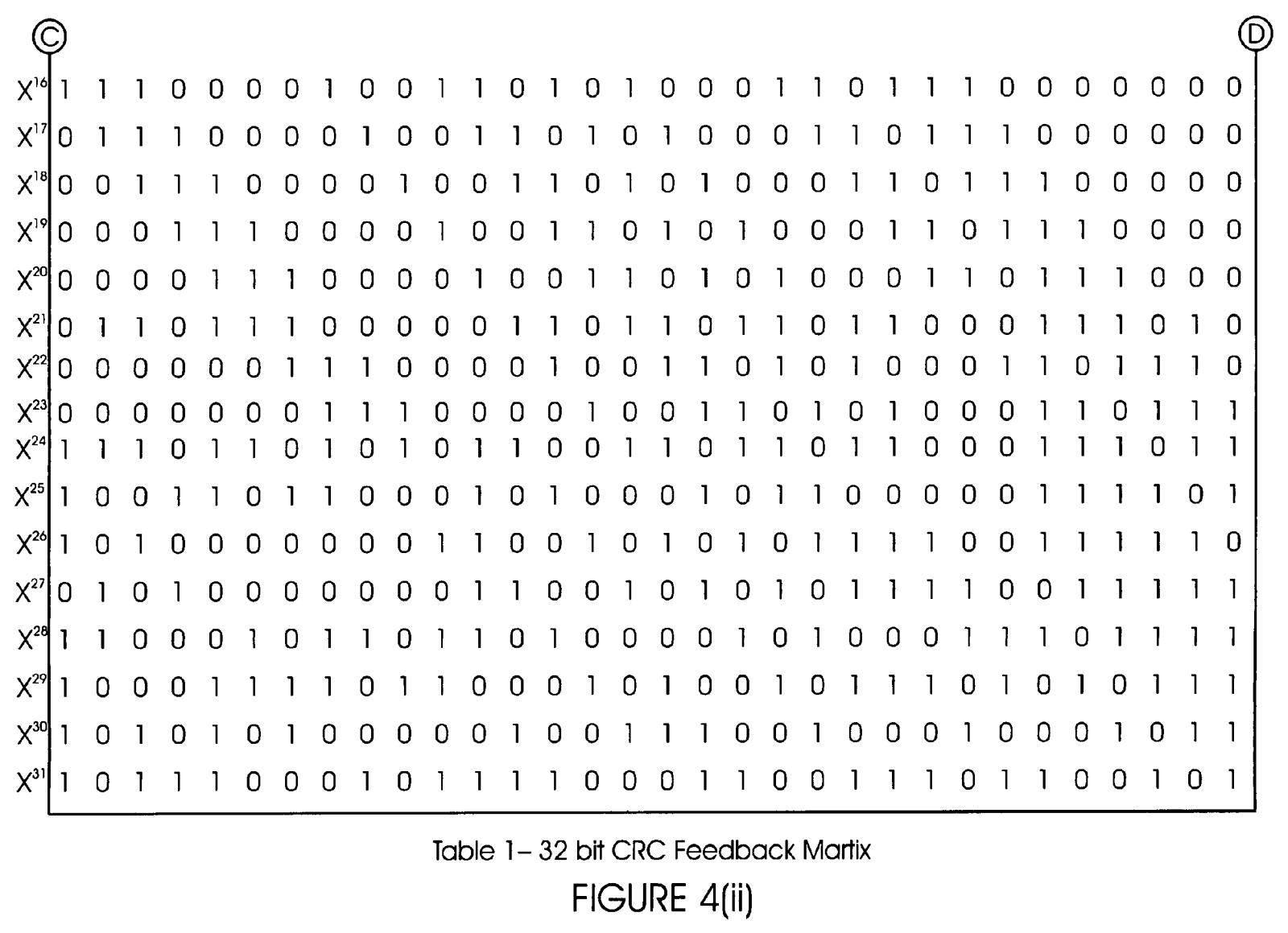

In one aspect of the present invention, an n×r feedback multiplier (202, FIG. 2A) is used for systematic encoding of the CRC that can be computed by taking the remainder when dividing $x^{r+n}$ by g(x). This can be done as follows, in a spreadsheet format (as shown in Table 1—FIG. 4 below):

$x^r - g(x)$ is by definition the systematic CRC for the $x^0$ identity message polynomial. Since g(x) is monic, and of degree r, the most significant bit of g(x) is cancelled to form the remainder mod ($x^r - 1$). This will be the $x^0$ row of the feedback multiplier 202.

Continue shifting g(x) one place to the left, building each row i of the n row feedback multiplier 202 using the following rule:

1. If the r-$1^{st}$ bit of the previous row is a one, then form row$_n$ by adding the lower r bits of g(x) to the shift of row$_{n-1}$.
2. If the r-$1^{st}$ bit of the previous row is a zero, then row$_n$ is just the shift of row$_{n-1}$.

Using matrix computations, an n bit shift of the previously calculated CRC value can be accomplished with an r-dimensioned Identity matrix that has n columns rotated from left to right (i.e. an all zero r×r matrix where a 1 exists only in positions $a_{ij}$ in the matrix where $j = i + n \bmod(r)$).

The CRC is computed using equation 5 shown above, taking care to segment the previously computed CRC value for use in a present calculation. The most significant n bits of the previous CRC value are added to the present data input. The systematic generator matrix to create a result with dimension r multiplies the sum. The r-bit result is added modulo 2 to the properly positioned r−n lower order bits of the previous CRC value (the least significant r−n bits are shifted n places). This final result is the CRC for the two message segments. The process continues iteratively until the CRC code has been generated for all the data.

To avoid the bit-reversals described in the ANSI Fibre Channel and SCSI specifications, consider bit 0 of an input to correspond to the most significant data input bit within the feedback multiplier 202 and CRC accumulator 203. Since the LSb is by convention the first bit to be transferred across the interface it corresponds to the high order bit of the CRC accumulator 203.

The CRC accumulator 203 results are interpreted as the first bit out being the LSb of the CRC. This means that bit 31 of the CRC accumulator 203 becomes the LSb of the CRC. The ordering can remain stable if the feedback multiplier 202 matrix is ordered so that the top row corresponds to the least significant input bit's row, and the far right column corresponds to the most significant output bit of the feedback multiplier 202. The accumulator 203 then accumulates data in the correct orientation for SCSI and FC specifications including its parallel representation in 32 bits.

Application to various sizes of n (where n is the data block size):

There are three possible scenarios to consider: n<r, n=r, n>r. The procedure outlined above provides a method for handling n<r.

For n>1, a matrix of n rows and r columns is used to perform the division of an n bit segment by g(x).

The case where n=r requires no cyclic shift of the accumulated CRC value as an r bit rotation returns the accumulated CRC to its original position. Since the message segment's dimension is equal to the dimension of the accumulated CRC, the new accumulated CRC value is computed by XORing the accumulated CRC with the new data and multiply it by the generator.

For cases where n>r, all n code words corresponding to the n identity bits in the segment m are computed. Using only the r columns of the code word left after eliminating the identity message terms, one can create an n row by r column matrix that is used as the feedback multiplier 202 matrix for calculating the new accumulated CRC value. If n is not a multiple of r then the previously accumulated CRC value is shifted in an n bit cyclic fashion prior to adding it to the upper r bits of the message segment m.

Hardware Implementation:

FIG. 2A shows one example of a hardware system used to implement the adaptive aspects of the present invention. The hardware system may be located in ECC module 109 or any other module of disk controller 101. FIG. 2A shows system 200 with a data segment staging register 201 (may also be referred to as "register 201"), a n×r Feedback Multiplier 202 (may also be referred to as "multiplier 202" or "feedback multiplier 202") and a CRC accumulator register 203 (may also be referred to as "accumulator 203" or "CRC accumulator 203") to implement accumulation of an r bit CRC on n bit data segments. To illustrate the adaptive aspects of the present invention, r−n bits 204, n bits 205 and n bits of data 206 are shown separately in FIG. 2.

New n bits of data 206 are XORed with n bits of previously accumulated CRC value in accumulator 203 (shown as 205A). The XORed result (shown as 205B) is sent to multiplier 202. The result 205B is multiplied with an n×r bit, as determined by using the spreadsheet calculation technique shown above in Table 1.

Thereafter, the upper r−n bits of the multiplier 202, shown as 204C is added to the lower r−n bits of the previously stored CRC values (shown as 204A). The result of the addition, 204B, is then stored in the upper bits of the accumulator 203. The stored value is shown as 204D in accumulator 203. Also, the lower n bits from the multiplier 202 are stored in the lower n bits of the accumulator 203 (shown as 205C).

Figure 3A:
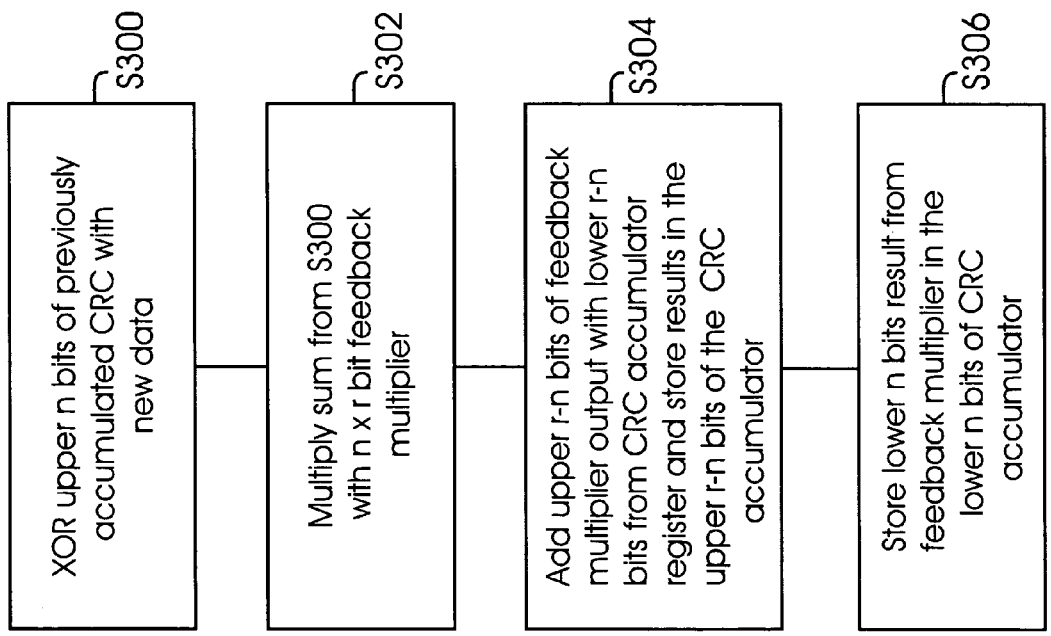
FIG. 3A shows a process flow diagram for using the system in FIG. 2A, according to one aspect of the present invention.

FIG. 3A shows a flow diagram for using system 200, according to one aspect of the present invention. In step S300, the upper n bits of previously accumulated CRC value (205A) are XORed with new data word (206).

In step S302, the sum from step S300 is multiplied with an n×r multiplier 202.

In step S304, the upper r−n bits of multiplier 202 output (shown as 204C) are added with lower r−n bits (204A) of accumulator 203. The result 204B is stored in the upper r−n bits of accumulator 203 (shown as 204D).

In step S306, the lower n bits from multiplier 202 are stored in the lower n bits of accumulator 203 (shown as 205C).

Figure 2B:
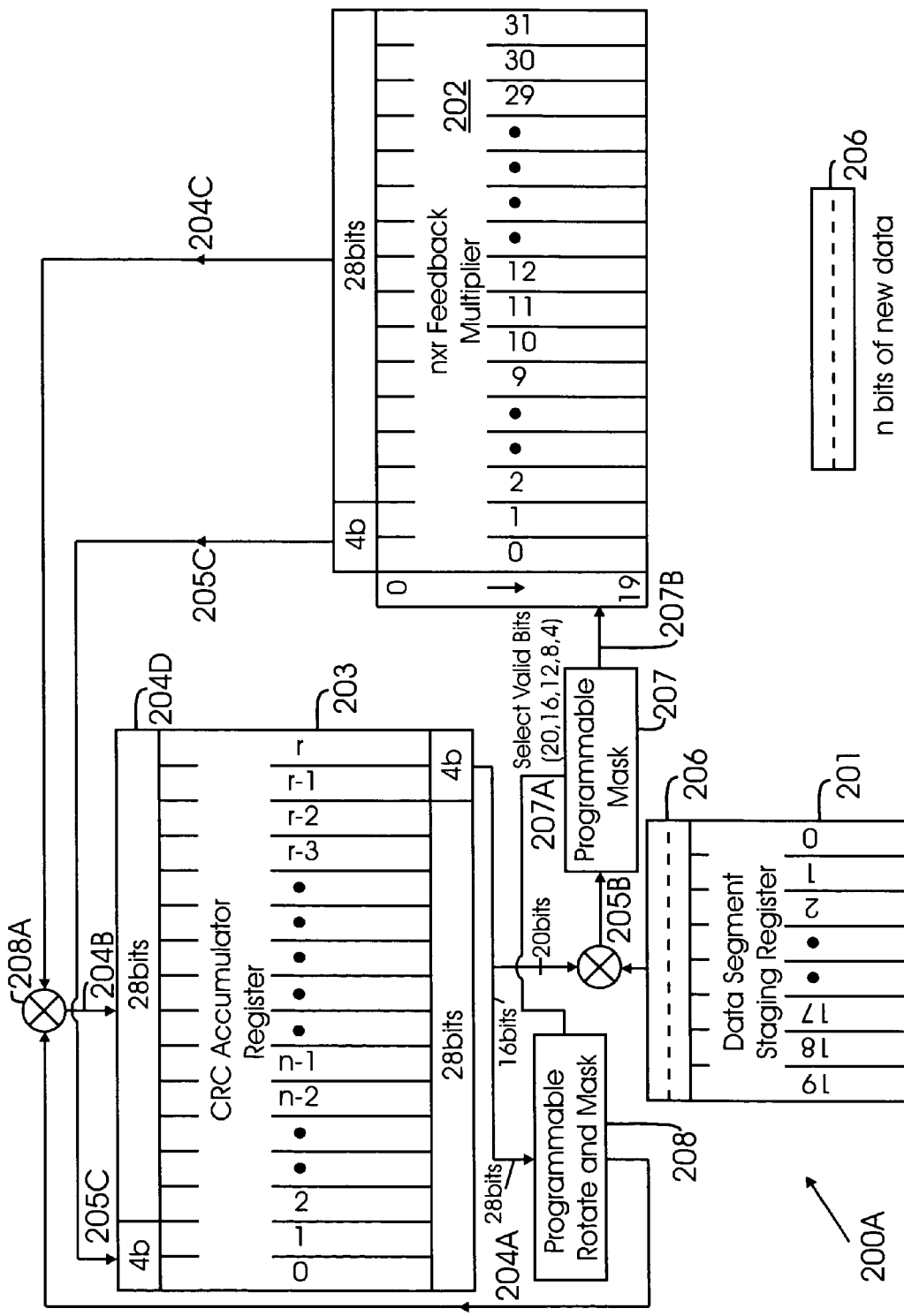
FIG. 2B shows a schematic for a 20-bit programmable CRC accumulator, according to one aspect of the present invention.

20-Bit Accumulation of 32-Bit CRC:

FIG. 2B shows an example of system 200A for 20-bit accumulation of 32-bit CRC, according to one aspect of the present invention. To allow disk formatter 112 to support a 10-bit symbol (instead of an 8-bit symbol), CRC residues are accumulated on the basis of 20 bit symbols.

This problem is further complicated in that sector sizes are not necessarily congruent to the new symbol size, in fact sectors are congruent to 16 bits (modulo 2-bytes). Since Disk Formatter 112 accumulates data two 10-bit symbols at a time, there are five ending conditions for CRC accumulation, four of which terminate with only part of the last 20 bits being valid. The CRC is checked in other components on byte boundaries, so CRC is accumulated without pads appended to the end of the data stream. System 200A accommodates the requirements of this new interface. To accommodate the foregoing requirements:

Data is presented to a CRC generator/checker (not shown) 20 bits at a time;

The last data for a sector may not occupy the full 20 bits since sectors are modulo 16 bits not modulo 20 bits;

The difference in sector size, and symbol size imposes the need to support calculations of all possible differences in a given modulo 2-byte sector size. The residual data presented on the last 20 bit segment are simply n*16 mod 20. There may be five unique solutions, as shown in Table 2, FIG. 5.

Each Sector begins on an even 20-bit boundary for CRC computation, i.e. last 20-bit data segment will not contain data from two different sectors. Therefore, the data within a FIFO (not shown) used between disk formatter 112 and buffer controller 108 will be not be "packed" even though the data in the DRAM buffer (111) will be "packed". Therefore, the assembly/disassembly logic will need to be aware of the position of the last byte of the sector, and justify the next sector so that it will be presented to the disk formatter 112 on a justified 20-bit boundary. The last 20-bit data segment may contain 4, 8, 12, 16, or 20 valid data bits depending upon the sector size. This information is used to configure the Programmable Rotate and Mask (208 of FIG. 2B), and the Programmable Mask (207 of FIG. 2B).

The CRC result is computed without benefit of any pad bytes to fill out the 20-bit CRC input vector. Hence, the CRC will match with other CRC generator/checker units in the disk controller (FIG. 1A) that will continue to operate with data organized in a modular 8-bit byte fashion.

Accumulating the 32-bit CRC for the 20-bit input data can be accomplished using the techniques described above. The CRC can be computed by encoding the feedback multiplier 202 with only the least significant twenty rows (i.e. the top twenty rows from Table 1 (FIG. 5)) of the 32-bit CRC feedback multiplier 202. The rest is accomplished by adding the least significant 12 bits of the CRC accumulator 203 to the most significant 12 bits of the product from the Feedback multiplier 202 prior to updating the CRC accumulator 203.

The last 20 bits submitted for CRC accumulation can hold one of five quantities of valid data bits: 0, 16, 12, 8, 4. The value will depend upon the modulo five division of the number of double-bytes in the sector. For example: a 512-byte sector has 256 double-bytes. Taking 256 modulo-5 leaves a residue of 1. Therefore there are 16 valid data bits in the last 20 bits submitted for checking/generation.

Disk formatter 112 can support an arbitrary sector size as long as it is modulo 16-bit (2-byte). Disk formatter 112 logic is constructed to handle all values for N (a barrel shifter output that is described below in detail), however, the value for N does not change for a given sector size selection.

To support the general case of all five values of residue the feedback multiplier 202 is adjusted to the correct number of row inputs, and the remaining bits of the CRC accumulator 203 justified to the 31$^{st}$ data bit position and added to the result from multiplier 202 before updating the CRC accumulator 203. Table 3 in FIG. 6 shows the bits to enable multiplier 202 for the last segment. By providing a programmable barrel shifter for the accumulator 203 data and a programmable mask 207 for the inputs to the Feedback Multiplier 202 a single feedback multiplier/accumulator can accomplish all tasks.

Y[0]=X[0]^X[6]^X[9]^X[10]^X[12]^X[16];
Y[1]=X[0]^X[1]^X[6]^X[7]^X[9]^X[11]^X[12]^X[13]^X[16]^X[17];
Y[2]=X[0]^X[1]^X[2]^X[6]^X[7]^X[8]^X[9]^X[13]^X[14]^X[16]^X[17]^X[18];
Y[3]=X[1]^X[2]^X[3]^X[7]^X[8]^X[9]^X[10]^X[14]^X[15]^X[17]^X[18]^X[19];
Y[4]=X[0]^X[2]^X[3]^X[4]^X[6]^X[8]^X[11]^X[12]^X[15]^X[18]^X[19];
Y[5]=X[0]^X[1]^X[3]^X[4]^X[5]^X[6]^X[7]^X[10]^X[13]^X[19];
Y[6]=X[1]^X[2]^X[4]^X[5]^X[6]^X[7]^X[8]^X[11]^X[14];
Y[7]=X[0]^X[2]^X[3]^X[5]^X[7]^X[8]^X[10]^X[15]^X[16];
Y[8]=X[0]^X[1]^X[3]^X[4]^X[8]^X[10]^X[11]^X[12]^X[17];
Y[9]=X[1]^X[2]^X[4]^X[5]^X[9]^X[11]^X[12]^X[13]^X[18];
Y[10]=X[0]^X[2]^X[3]^X[5]^X[9]^X[13]^X[14]^X[16]^X[19];
Y[11]=X[0]^X[1]^X[3]^X[4]^X[9]^X[12]^X[14]^X[15]^X[16]^X[17];
Y[12]=X[0]^X[1]^X[2]^X[4]^X[5]^X[6]^X[9]^X[12]^X[13]^X[15]^X[17]^X[18];
Y[13]=X[1]^X[2]^X[3]^X[5]^X[6]^X[7]^X[10]^X[13]^X[14]^X[16]^X[18]^X[19];
Y[14]=X[2]^X[3]^X[4]^X[6]^X[7]^X[8]^X[11]^X[14]^X[15]^X[17]^X[19];
Y[15]=X[3]^X[4]^X[5]^X[7]^X[8]^X[9]^X[12]^X[15]^X[16]^X[18];
Y[16]=X[0]^X[4]^X[5]^X[8]^X[12]^X[13]^X[17]^X[19];
Y[17]=X[1]^X[5]^X[6]^X[9]^X[13]^X[14]^X[18];
Y[18]=X[2]^X[6]^X[7]^X[10]^X[14]^X[15]^X[19];
Y[19]=X[3]^X[7]^X[8]^X[11]^X[15]^X[16];
Y[20]=X[4]^X[8]^X[9]^X[12]^X[16]^X[17];
Y[21]=X[5]^X[9]^X[10]^X[13]^X[17]^X[18];
Y[22]=X[0]^X[9]^X[11]^X[12]^X[14]^X[16]^X[18]^X[19];
Y[23]=X[0]^X[1]^X[6]^X[9]^X[13]^X[15]^X[16]^X[17]^X[19];
Y[24]=X[1]^X[2]^X[7]^X[10]^X[14]^X[16]^X[17]^X[18];
Y[25]=X[2]^X[3]^X[8]^X[11]^X[15]^X[17]^X[18]^X[19];
Y[26]=X[0]^X[3]^X[4]^X[6]^X[10]^X[18]^X[19];
Y[27]=X[1]^X[4]^X[5]^X[7]^X[11]^X[19];
Y[28]=X[2]^X[5]^X[6]^X[8]^X[12];
Y[29]=X[3]^X[6]^X[7]^X[9]^X[13];
Y[30]=X[4]^X[7]^X[8]^X[10]^X[14];
Y[31]=X[5]^X[8]^X[9]^X[11]^X[15];

Equation 1—Feedback Multiplier for 20 Bit Accumulation of 32 Bit CRC

The bit-significance of the Feedback Multiplier 202 matches the CRC Accumulator Register 203 inputs, but is reversed from that of the CRC accumulator register 203 outputs. That is the CRC Accumulator register 203 treats bit 0 of the data as the first bit to be processed by the CRC generation/checking module. The Feedback Multiplier 202 result for bit zero becomes the least significant bit of the CRC accumulator 203, but when the result is transferred, the data is sent from bits 24:31 first, followed in order by 16:23; 8:15; and finally 0:7.

If the Feedback multiplier 202 and the shift logic follow the bit ordering of the CRC Accumulator Register 203 much of this confusion can be avoided. If we were to apply that convention we would reverse the Y[n] bit to correspond instead to the equation for Y[31−n] in the equations above. So that instead of thinking of the rotation as being bits 11:0 up to bits 31:20, instead we would consider it as a shift of bits 31:20 down to bits 11:0.

Programmable Mask for Feedback Multiplier Input:

Programmable mask 207 is used to mask 205B before it is sent to multiplier 202. All results for XOR gates with invalid inputs are masked to zero. A zero vector on the MSb inputs to the Feedback Multiplier 202 prevents those bits from affecting the outputs of the Feedback Multiplier 202. Therefore they have no affect on the CRC computation.

Figure 2C:
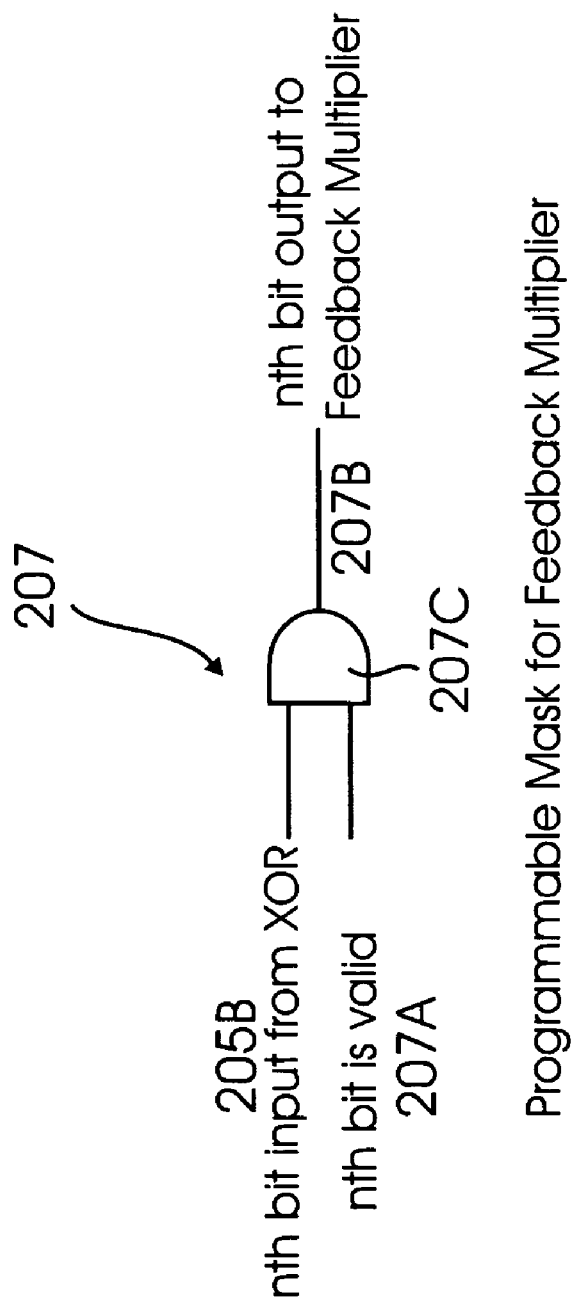
FIG. 2C shows a schematic for applying a programmable mask, according to one aspect of the present invention.

FIG. 2C shows one way of implementing programmable mask 207. Inputs 205B and 207A are sent to gate logic (AND gate) 207C. Output 207B is then sent to multiplier 202.

Programmable Rotation and Mask Module 208:

When less than 20 bits are valid for the final data segment CRC computation, system 200A justifies (shift to the most significant bit position i.e. bit 31) a correspondingly larger number of lower order bits from CRC Accumulator Register 203. The number of bits, how far to shift them, and their final position are indicated in the Table 4, FIG. 7.

In one aspect of the present invention, module 208 includes a barrel shifter that is used with five selections for each output. The correspondence of each bit for all values of 16 bit offsets is shown below. The implementation can be optimized to minimize hardware by using a programmable "AND" array to mask outputs 19:4 just as was done for the feedback multiplier 202 masks. By using an external mask on the rotation module smaller multiplexers can be used to affect the barrel shift for bits 19:0. With this implementation it would be possible to use a 4×1 multiplexer for bits 19:15, a 3×1 multiplexer for bits 15:12; a 2×1 multiplexer for bits 11:8, and no multiplexer for bits 7:4.

All 28 outputs (bit positions 31:4) of the programmable rotate and mask module 208 can be applied directly to the XOR gates used to sum these bits with bits 31:4 of the Feedback Multiplier 202. By masking to "0" the bit positions that are not used the XOR result at those locations will be unaffected by the rotated data. Table 5 in FIG. 8 shows barrel shifter and mask relationship, used according to one aspect of the present relationship.

Determination of N

For this implementation it is presumed that, all 20 bits are valid, for all except the last 20-bit data segment of a sector.

Therefore N will be "0" for all except the last data segment. The value of N for the last segment of the sector is computed by reducing the number of double-bytes in the sector by modul-5. A non-zero N value is valid only for the last data segment of the sector. At all other times N is forced to zero. For a fixed sector format the value of N for the last data segment will be known in advance and can be programmed by firmware into a configuration register or can be derived directly from the sector size configuration value.

Figure 3B:
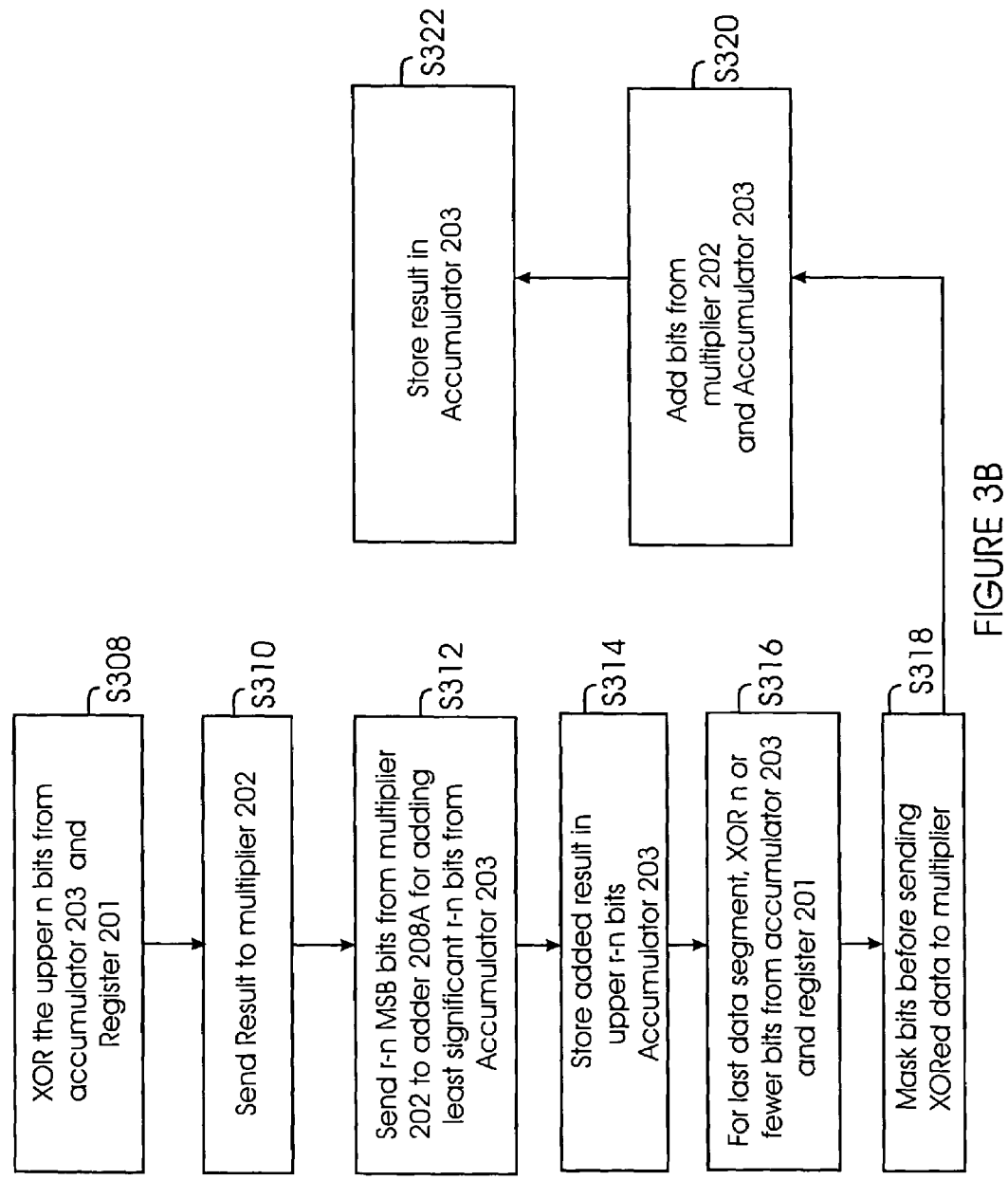
FIG. 3B shows a process flow diagram for using the system in FIG. 2B, according to one aspect of the present invention.

FIG. 3B shows a process flow diagram for using system 200A in FIG. 2A/2B.

Turning in detail to FIG. 3B, in step S308, the upper bits from accumulator 203 bits (205A) and register 201 bits (206) are XORed. In this case, the number of bits is 20.

In step S310, the XORed results are sent to multiplier 202.

In step S312, r–n MSB (shown as 204C) are sent to adder 208A and added with the least significant r–n bits (204A) from accumulator 203. The result (204B) is stored in the upper r–n bits of accumulator 203, in step S314.

For the last data segment, n or fewer (for example 16) bits from register 201 and accumulator 203 are XORed in step S316. In step S318, the XORed result is masked by programmable mask 207. The masked result 207B is then sent to multiplier 202. In one aspect of the present inventions, using programmable mask 207 masks 4 bits.

In step S320, bits (for example, 16 bits) from multiplier 202 are sent to adder 208A. Bits (for example, 16-bits) from accumulator 203 are added to 16 from multiplier 202. Then in step S322, the result is then stored in the most significant 16 bits of the accumulator 203. The least significant 4 bits of the multiplier 202 are stored in the least significant bits of the accumulator 203.

In one aspect of the present invention, an integrated solution is provided so that the disk formatter may handle different data segment sizes efficiently.

Although the present invention has been described with reference to specific embodiments, these embodiments are illustrative only and not limiting. Many other applications and embodiments of the present invention will be apparent in light of this disclosure and the following claims.

What is claimed is:

1. A method for processing data segments used for calculating cyclic redundancy check ("CRC"), comprising:
    combining n bits from a CRC accumulator containing previously accumulated CRC and incoming data segments to form combined results, wherein n is an integer;
    sending the combined results to a multiplier;
    adding bits from the multiplier and the CRC accumulator; and
    storing a result from the adding of the bits in the CRC accumulator and the multiplier, wherein CRC may be accumulated on any size data segment.

2. The method of claim 1, wherein the n bits from the CRC accumulator are XORed with the incoming data segments to form an XORed result.

3. The method of claim 1, wherein a data segment register is used to store incoming data segments.

4. The method of claim 2, wherein the XORed result is masked before the XORed result is sent to the multiplier for a last data segment.

5. The method of claim 4, wherein the number of masked bits depend on a size of the last data segment.

6. The method of claim 1, wherein the bits from the CRC accumulator that are added to the bits from the multiplier are rotated.

7. The method of claim 1, wherein the bits from the CRC accumulator that are added to the bits from the multiplier are masked.

8. A disk controller for accumulating cyclic redundancy check ("CRC") values, comprising:
    a register for staging data segments of variable size;
    a CRC accumulator for accumulating CRC for data segments of variable size;
    a feedback multiplier that receives n bits from the CRC accumulator containing previously accumulated CRC and incoming data segments from the register, wherein n is an integer; and wherein bits from the multiplier and the CRC accumulator are added and a result from the adding is stored in the CRC accumulator.

9. The disk controller of claim 8, wherein the n bits from the CRC accumulator are XORed with the incoming data segments to form an XORed result.

10. The disk controller of claim 9, wherein the XORed result is masked before the XORed result is sent to the feedback multiplier for a last data segment.

11. The disk controller method of claim 10, wherein the number of masked bits depend on a size of the last data segment.

12. The disk controller of claim 8, wherein the bits from the CRC accumulator that are added to the bits from the multiplier are rotated.

13. The disk controller of claim 8, wherein the bits from the CRC accumulator that are added to the bits from the multiplier are masked.

14. A storage system, comprising:
    a storage device; and
    a storage device controller for accumulating cyclic redundancy check ("CRC") values includes a register for staging data segments of variable size;
    a CRC accumulator for accumulating CRC for data segments of variable size;
    a feedback multiplier that receives n bits from the CRC accumulator containing previously accumulated CRC and incoming data segments from the register, wherein n is an integer; and wherein bits from the multiplier and the CRC accumulator are added and a result from the adding is stored in the CRC accumulator.

15. The storage system of claim 14, wherein upper bits from the CRC accumulator are XORed with the incoming data segments to form an XORed result.

16. The storage system of claim 15, wherein the XORed result is masked before the XORed result is sent to the feedback multiplier for a last data segment.

17. The storage system of claim 16, wherein the number of masked bits depend on a size of the last data segment.

18. The storage system of claim 14, wherein the bits from the CRC accumulator that are added to the bits from the multiplier are rotated.

19. The storage system of claim 14, wherein the bits from the CRC accumulator that are added to the bits from the multiplier are masked.

20. The storage system of claim 14, wherein the storage device includes at least one of a hard disk and a tape drive.

* * * * *

UNITED STATES PATENT AND TRADEMARK OFFICE
CERTIFICATE OF CORRECTION

PATENT NO.        : 7,543,214 B2  
APPLICATION NO. : 11/056320  
DATED             : June 2, 2009  
INVENTOR(S)       : Paul B. Ricci It is certified that error appears in the above-identified patent and that said Letters Patent is hereby corrected as shown below:

| | |
|---|---|
| Column 1, Line 53 | Delete "have" and insert -- has -- |
| Column 4, Line 41 | Delete "support's" and insert -- supports -- |
| Column 5, Line 24 | Delete second occurrence of "expressed as" |
| Column 8, Line 47 | Delete "be" after "will" |
| Column 11, Line 24 | Delete "inventions" and insert -- invention -- |

Signed and Sealed this

Twenty-first Day of July, 2009

JOHN DOLL  
*Acting Director of the United States Patent and Trademark Office*